(12) United States Patent
Martin et al.

(10) Patent No.: US 7,721,183 B2
(45) Date of Patent: May 18, 2010

(54) METHOD AND APPARATUS FOR PROVIDING SEU-TOLERANT CIRCUITS

(75) Inventors: Alain J. Martin, Pasadena, CA (US); Wonjin Jang, Pasadena, CA (US); Mika Nystroem, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 503 days.

(21) Appl. No.: 11/216,577

(22) Filed: Aug. 30, 2005

(65) Prior Publication Data
US 2006/0090099 A1    Apr. 27, 2006

Related U.S. Application Data

(60) Provisional application No. 60/605,457, filed on Aug. 30, 2004.

(51) Int. Cl.
*H03M 13/00* (2006.01)
(52) U.S. Cl. ............... 714/780; 714/710; 714/799

(58) Field of Classification Search ............. 714/710, 714/752, 780; 326/10; 327/208
See application file for complete search history.

(56) References Cited

U.S. PATENT DOCUMENTS

| 6,549,443 | B1 | 4/2003 | Jensen et al. |
| 7,023,235 | B2* | 4/2006 | Hoff .................... 326/10 |
| 7,167,033 | B2* | 1/2007 | Arima et al. ............ 327/208 |

* cited by examiner

*Primary Examiner*—Esaw T Abraham
(74) *Attorney, Agent, or Firm*—Milstein Zhang & Wu LLC; Joseph B. Milstein

(57) ABSTRACT

The invention provides circuits that are tolerant to soft errors, such as a single event upset (SEU). The circuits have a chain of permitted state changes. Redundant elements, including redundant literals and assignments, are designed and implemented in the circuit. The design is such that a disruption or change of state on a single element by an SEU will not change the state flow of a circuit or lead to impermissible state changes. In one embodiment, the invention is implemented in quasi-delay-insensitive (QDI) asynchronous circuits.

7 Claims, 5 Drawing Sheets

Deadlock

Abnormal

Tolerant

METHOD AND APPARATUS FOR PROVIDING SEU-TOLERANT CIRCUITS

The present application claims the benefit of priority from pending U.S. Provisional Patent Application No. 60/605,457, entitled "Methods and Circuit Techniques for Making VLSI Systems Tolerant to Single-Event Upsets", filed on Aug. 30, 2004, which is herein incorporated by reference in its entirety

STATEMENT REGARDING FEDERALLY SPONSORED RESEARCH

The U.S. Government has certain rights in this invention pursuant to Grant No. F29601-00-K0184 awarded by the AFOSR.

BACKGROUND OF THE INVENTION

1. Field of the Invention

This invention relates to the field of integrated circuits.

2. Background

Integrated circuits are sometimes used in environments and conditions where there may be a chance of soft errors. An error that does not damage the circuit but just changes the state of the circuit is called a "soft error". A soft error due to excess charge (primarily induced by ionizing particles) is called a Single-Event Upset (SEU). Among the causes of soft errors are environments where there may be exposure to high energy particles.

With the continuous scaling down of VLSI circuits, the number of nodes in a system keeps increasing while the charge stored at a node keeps decreasing (due to lower capacitance and lower supply voltages). As a result, the probability that a soft error will affect a state of the system increases.

There have been prior art attempts to reduce the effects of soft errors. At the system level, Triple Modular Redundancy (TMR) is a general solution in case of a single error in circuits. It consists in triplicating computation cells and implementing a voter to determine the correct value. In other words, each circuit is implemented three times. The outputs are provided to a voter that provides as output the same output as any two or more of the inputs to the voter. With three circuits, an SEU on any one of them still results in two "correct" circuits. The voter will still output a correct value. One problem with TMR is that the system will fail if the voter fails regardless of whether cells fail or not. One prior art solution to this problem is to use three identical copies of the voter as well as three copies of the input elements. This scheme is also known as triplicated TMR.

Another problem is that if a common clock signal between the computation cells fails, then the TMR system cannot mask the error. A fault-tolerant TMR clock can be designed to address this problem. However, the majority voting scheme of TMR cannot readily be used to design SEU-tolerant circuits of certain types (e.g. quasi-delay-insensitive "QDI") because the scheme may lead to a deadlock or an instability in the circuit. An SEU at Boolean variables used to implement communication protocols can cause a computation cell to generate an unexpected output or to skip an expected output. If an output is missed, a deadlock may happen in the voter that waits for the output.

Another system-level approach to protect circuits from SEUs is the use of error correction codes such as Hamming codes. However, Hamming codes are of no use for SEUs affecting the control variables (for instance the handshake variables) of a QDI circuit.

SUMMARY OF THE INVENTION

The invention provides circuits that are tolerant to soft errors, such as a single event upset SEU). The circuits may have a chain of permitted state changes. Redundant elements, including redundant literals and assignments, are designed and implemented in the circuit. The design is such that a disruption or change of state on a single element by and SEU will not change the state flow of a circuit or lead to impermissible state changes. In one embodiment, the invention is implemented in quasi-delay-insensitive (QDI) asynchronous circuits.

DETAILED DESCRIPTION OF THE PREFERRED EMBODIMENTS

Figure 1:
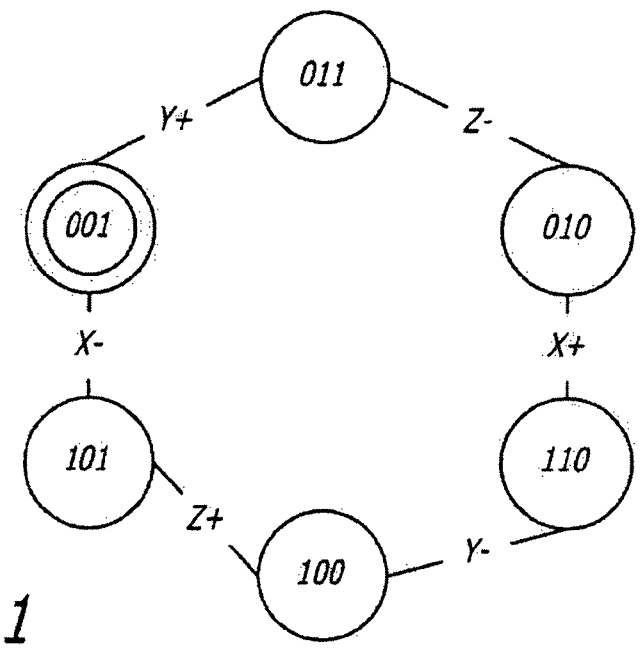
FIG. 1 is a state diagram illustrating permissible state changes.

A method for making soft error tolerant circuits is described. In the following description, numerous specific details are set forth in order to provide a more detailed description of the invention. In other instances, well known features have not been described in detail so as not to obscure the invention. It is understood to one of skill in the art, that the invention may be practiced without these specific details.

The invention is described in conjunction with asynchronous circuits and by way of example, QDI circuits. However, the invention is not limited to these examples, and other circuits can be implemented without departing from the scope and spirit of the present invention.

QDI Circuits

QDI circuits are modeled using the HSE (handshaking expansion) and PRS (production rule set) notations such as described in Alain J. Martin, "Synthesis of Asynchronous VLSI Circuits", *Formal Methods for VLSI Design*, ed. J Staunstrup, North-Holland, 1990. However, any modelling notations may be used without departing from the scope or spirit of the invention. One methodology for designing asynchronous VLSI circuits involves first writing a high-level language description in a Communicating Hardware Processes (CHP) language. A CHP program consists of one or more concurrent processes communicating via channels.

A CHP program is decomposed into concurrent CHP processes that are small enough to be easily compiled into the intermediate Handshaking Expansion (HSE) language. In HSE, the communication actions on channels are replaced with their "handshaking expansions" which are sequences of waits and assignments to the Boolean variables implementing a hand-shaking protocol between sender and receiver. (These variables correspond to nodes in the physical implementation.)

The HSE is subsequently transformed into a Production-Rule Set (PRS) that is the canonical representation of a QDI circuit. A Production Rule (PR) has the form G→S, where G is a Boolean expression called the guard of the PR, and S is a simple assignment. A simple assignment is z↑ or z⇓, corresponding to z:=true or z:=false. An execution of a PR G→S is an unbounded sequence of firings. A firing of G→S with G true amounts to the execution of S, and a firing with G false amounts to a skip. If the firing of a PR does change any variable's value, the firing is called effective. Hereafter, if a PR fires, it means that the firing is effective.

A PR G→S is said to be stable if whenever G becomes true it remains true until the assignment S is completed. Two PRs G1→zT and G2→zt are non-interfering if and only if ¬G1∨¬G2 always holds. Stability and non-interference guarantees that the execution of a PR set is hazard-free. Non-self-invalidating of PRs is necessary to implement a PR Set (PRS) in CMOS technology because the assignment of nodes are not instantaneous in the physical implementation. A PR G→z↑ is said to be self-invalidating when z⇒¬G. Likewise G→z⇓ is self-invalidating when ¬z⇒G. In the following description, we only consider stable, non-interfering, and self-invalidating-free PR Set (PRS).

The two complementary PRs that set and reset the same variable, such as G1→z↑ and G2→z⇓ form a gate. The variables in the guards are inputs of the gate and the variable in the assignment is the output of the gate. If G1≠¬G2 holds, then z is a state-holding variable. In a CMOS implementation, state-holding variables that are not always driven need staticizers. A QDI circuit, which interacts with its environment, is an interconnection of gates. Each input of a gate is either connected to the output of another gate, or to an environment. An input of a gate that is connected to the environment is a primary input; an output that is connected to the environment is a primary output. The environment sets values of primary inputs by reacting to values of primary outputs of the circuit according to a specification such as a four-phase handshaking protocol. We say that a circuit and its environment form a system.

Consider a PRS with Boolean variables $x_1, x_2, \ldots, x_n$. A state representation of the PRS is a vector with one element per variable. (For convenience, we use "0" for false and "1" for true in a state representation.) And $s[x_k]$ is the value of $x_k$ in the state s. assignment(P) is the simple assignment of the PR P. For example, assignment(x∧y→z↑)=z↑. For a PR P and a state s, enb(s, P) is true if and only if the guard of P is true in the state s. We say that PR P is enabled in state s. And for a PR P and a state s, eff(s, P) is true if and only if firing of P in state s changes the value of a variable. We call such a PR effective in the state s. An execution path $<P_1, \ldots, P_{m-1}, P_m>$ of a PRS is a trace of firings of PRs from an initial state. An execution-path set of a PRS is a set of every possible execution path from an initial state of the PRS. A PRS Computation (PRSC) is defined as follows:

Two disjoint finite sets $\Sigma_{Env}$, called an environment, and $\Sigma_{Circuit}$, called a circuit, whose elements are PRs. $\Sigma^{let}=\Sigma_{Env}\cup\Sigma_{Circuit}$ An initial state $s_0\in\{0,1\}^n$. (n is the number of distinct variables in Σ.)

An execution-path set EP.

An environment path of an execution path is a projection of the execution path onto $_{EEnv}$. A finite set $S_v$ is called a valid-state set if its elements are states reachable from so by firing of PRs in E. A directed graph, called a transition diagram, is associated with a PRSC as follows. The vertices of the graph correspond to the valid states in $S_v$. If a PR P is effective in a state s, and it changes the state s into another state s', then there is an edge labeled P from s to s' in the transition diagram. If a PRSC is deadlock-free, for all s∈$S_v$, there exists P∈Σ such that eff (s, P) is true. That is, every vertex has at least one outgoing edge in a deadlock-free PRSC. From now on we consider only deadlock-free PRSC.

An example PRSC is as follows:
$\Sigma_{Env}=\{\neg Y\rightarrow Z\uparrow, Y\rightarrow Z\Downarrow\}$
$\Sigma_{Circuit}=\{\neg Y\rightarrow Y\uparrow, X\rightarrow Y\Downarrow, \neg Z\rightarrow X\uparrow, Z\rightarrow X\Downarrow\}$
An initial state $s_0=(X, Y, Z)=(001)$.
EP={<Y↑>, <Y↑, Z⇓>, <Y↑, Z⇓, X↑>, ...}

We will use only the assignment of a PR to rep-resent the PR in transition diagrams and execution paths for simplicity if it does not cause ambiguity. The environment-path set of the PRSC is {<Z↑>, <Z↑.Z⇓>, ...}.

FIG. 1 illustrates a transition diagram of the PRSC. At initial state (001) the allowed state transition is Y true to (011). The next transition is Z false to (010), X true to (110), Y false to (100), Z true to (101) and X false back to the initial state (001).

Single-Event Upset (SEU) in PRSC

Consider an SEU as flipping the value of a single variable in a PRSC. We expand the definition of an execution path with a symbol $seu_{xi}$ to include effects of SEU at $x_i$. For example, a SEU execution path of a PRS is $<P_i, \ldots, P_{k-1}, seu_{xi}, P_{k+1} \ldots, P_{m-1}, P_m>$, which means that an SEU at $x_i$ happens after the firing of the PR $P_{k-1}$, and the value of $x_i$ is flipped. (We will use the terms 'execution path' and 'SEU execution path' interchangeably.) A PRS Computation(PRSC) with SEU at a variable $x_i$ can be defined as follows:

Two disjoint finite sets $\Sigma_{Env}$, called an environment, and $\Sigma_{Circuit}$, called a circuit, whose elements are PRs. $\Sigma^{let}=\Sigma_{Env}\cup\Sigma_{Circuit}$ An initial state $s_0\in\{0,1\}^n$. (n is the number of distinct variables in σ.)

an SEU execution-path set $EP_{SEU}$.

Elements of the valid-state set S are states reachable from so only by firing of PRs in Σ, and those of the invalid-state set Q are states reachable with SEU at $x_i$ and unreachable without SEU at $x_i$. The vertices of the transition diagram with SEU correspond to the states in S and Q. If $s[x_i]\neq s[x_i]$, then there is a two-way edge labeled seu between s and s' in the transition diagram.

Figure 2A:
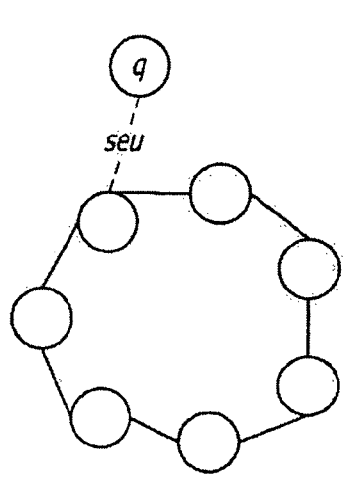
FIGS. 2A-2C are state diagrams illustrating the effect of SEUs on state transitions.
Figure 2B:
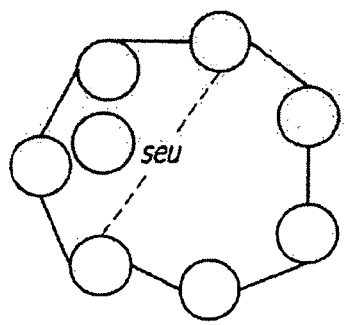
Figure 2C:
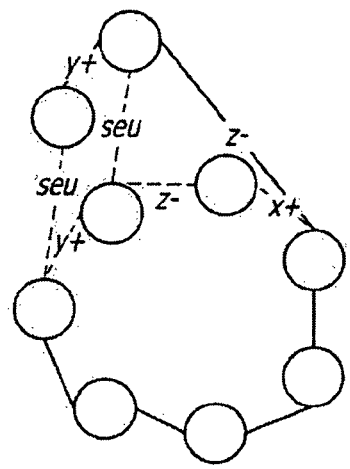

There are three types of possible PRSCs with SEU that are illustrated in FIGS. 2A, 2B, and 2C. (1) An SEU can cause a deadlock if there exists an invalid state q such that there are no effective PRs in the state q, as shown in FIG. 2A. In other words, if state q is reached via an SEU, there is no path back to any state, and the circuit becomes deadlocked. (2) Some PRs in $\Sigma_{Env}$ are excluded or added in SEU execution paths, compared with SEU-free execution paths. FIG. 2B illustrates this case. Note that the SEU creates the possibility of invalid state transitions, although to valid states. (3) An SEU may lead to an invalid state, but it does not inhibit a firing of other PRs. The invalid state will be eventually restored to a valid state, as shown in FIG. 2C.

In other words, if the environment-path set of a PRSC and that of the PRSC with SEU are the same, and there is no deadlock, then the PRS is SEU-tolerant because the environment cannot distinguish them. Otherwise, the PRS is SEU-vulnerable. The environment-path set of an SEU-vulnerable PRSC contains deadlock execution paths or abnormal-computation execution paths. The environment paths of abnormal computations are not included in the SEU-free environment-path set because some PRs in the paths of abnormal computations are missed or inserted unexpectedly.

SEU in QDI Buffers

A buffer is a basic building block of QDI circuits. There are three common implementations of buffers, which we call PCFB (Pre-Charged Full Buffer), PCHB (Pre-Charged Half Buffer), and WCHB (Weak-Condition Half Buffer). Let us consider a single-rail PCHB whose specification in CHP is *[L; R]. The input channel L of the buffer is encoded with two variables L and Le and the output channel R is encoded with two variables R and Re. The HSE of the PCHB is

*[[Re∧L]; R↑; Le⇓; [¬Re]; R⇓; [¬L]; Le↑]. (Le and Re are inverted-sense acknowledgment variables.)

An SEU may happen at Le, L, Re or R, but let us assume that the environment is free from an SEU and generates inputs such as L and Re correctly. This assumption helps us to isolate effects of an SEU inside the buffer. Consider an SEU at only Le or R.

The PRSC with SEU at Le is as follows:

$\Sigma_{Env}$ and $\Sigma_{Circuit}$ are the same as before.

An initial state $s_0$=(0101)

$EP_{SEU}$={<$seu_{Le}$>, <L↑>, ..., <L↑, $seu_{Le}$, L⇓, L↑, ...}

Figure 3:
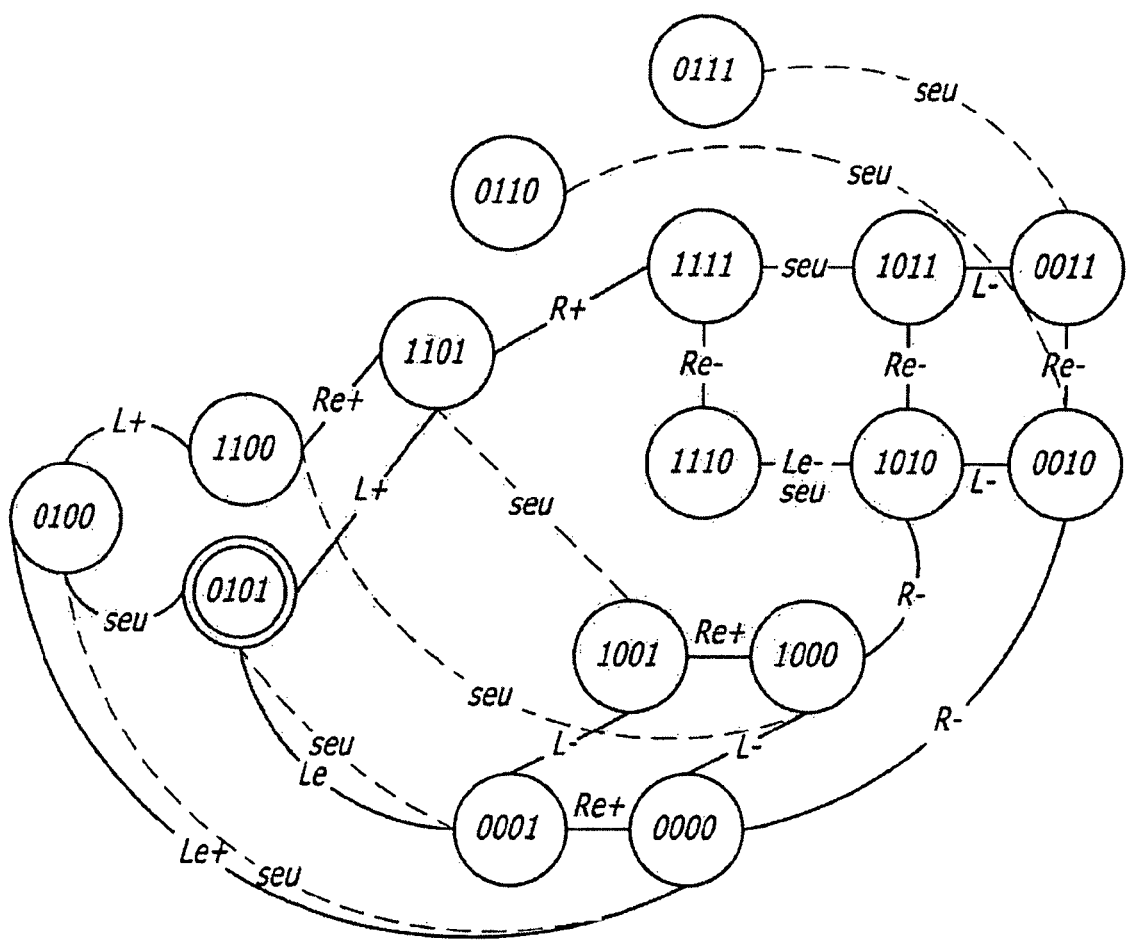
FIG. 3 is a state diagram illustrating SEUs at Le.

FIG. 3 illustrates the transition diagram of the PRSC with SEU at Le. The dotted circles indicate invalid states in Q, and the dotted edges indicate the possible transitions between states when an SEU occurs at Le.

The last firing L true in the environment path is added, compared with the SEU-free environment paths in EnvP. From the definition of SEU-vulnerability, we know that the PRSC with SEU at Le is SEU-vulnerable. The corresponding execution path <L↑, $seu_{Le}$, L⇓, Le↑, L◇> is an abnormal-computation path. This abnormal path corresponds to the situation that an input communication on L is acknowledged before an output communication on R is generated. Likewise, we can show that the PRSC with SEU at R is SEU-vulnerable: its abnormal path corresponds to the situation that the nth output is generated before the nth input has arrived. We can also show that the same abnormal computation occurs to other buffer implementations.

The acknowledgment of communications with one variable causes problems when an SEU happens. The change of the acknowledgment variable such as Le lets PRs in the environment fire, which results in resetting communications before a computation happens in a process. That is, firings of the PRs that can affect primary outputs are skipped, and some PRs are missed in the environment path. Similar misbehavior happens at data variables. With one-hot encoding, one Boolean variable is used per data value. If an SEU occurs at one of the data variables, then the environment may react as if there is a data value. That is, an SEU at a data variable can generate an output even though there are no inputs. Another data encoding scheme for a channel is k-out-of-n encoding in which k variables are set to true to transmit a value over the channel. If the Hamming distance between codewords, valid states of data variables, is less than 2, an SEU may cause the environment to react as if it got an incorrect data value. For example, (1100) and (0110) in 2-out-of-4 encoding are codewords, and the neutral state (0000) is passing through the state (0100) to reach the state (1100). If an SEU occurs at the third variable in the state (0100), then the environment acknowledges the incorrect codeword (0110). Communication through one variable can experience problems under SEU.

SEU-Tolerant Circuit Design

One embodiment of the invention provides for SEU tolerant design by using duplicate circuitry. This implementation is referred to as a "doubled-up production rule". All variables in PRS are duplicated to achieve SEU-tolerance. The invention prevents the deadlock and abnormal path SEU conditions from occurring in a circuit.

Consider a doubled-up PRS. Every guard in a PR G→S can be written in disjunctive normal form as follows:

... ∨( ... $x_i$∧$x_j$ ... )∨( ... ¬$x_k$∧$x_l$ ... )∨ ... →S

We replace all literals $x_i$ and ¬$x_i$ with $x_{ia}$∧$x_{ib}$ and ¬$x_{ia}$∧¬$x_{ib}$ and replace all assignments z↑ and z⇓ with $z_a$↑, $z_b$↑ and $z_a$⇓, $z_b$⇓. Then we have a doubled-up PRS.

For example, consider the following PRS, which describes a two input NAND:

x∧y→z⇓
¬x∨¬y→z↑

The doubled up NAND is:
($x_a$∧$x_b$)∧($y_a$∧$y_b$)→$z_a$⇓$z_b$⇓
(¬$x_a$∧¬$x_b$)∨(¬$y_a$∧¬$y_b$)→$z_a$↑$z_b$↑

It is clear that an SEU on any single variable of the four input variables does not result in an incorrect output.

Doubling up, however, may not be enough to provide QDI circuits with SEU-tolerance. A doubled-up PRS may experience deadlock under SEU. To compensate, we further implement a correction means that performs double-checking of doubled-up variables. We replace doubled-up variables such as $x_a$, $x_b$ in all assignments with new-variables such as $x_a$, $x_b$ and add supplemental C-elements whose inputs are $x_a$, $x_b$ and whose outputs are $x_a x_b$. (For purposes of this embodiment, the C element is an operator with two Boolean inputs, say x and y, and a Boolean output z s.t. The output z is set to true when x and y are true, z is set to false when x and y are false. If x and y have different values, z keeps its current value. By not changing state when the inputs have different values, the C-elements stop the propagation of errors due to SEUs.) For example, if we have doubled-up PRs as follows:

$G_{double}$→$x_a$↑, $x_b$↑
$G'_{double}$→$x_a$⇓, $x_b$⇓

Then we have the following PRs whose variables $x_a$, $x_b$ are double checked.

$G_{double}$→$x'_a$↑, $x'_b$↑
$G'_{double}$→$x'_a$⇓, $x'_b$⇓
$x'_a$∧$x'_b$→$x_a$↑, $x'_b$↑
¬$x'_a$∧¬$x'_b$→$x_a$⇓, $x_b$⇓

Figure 4:
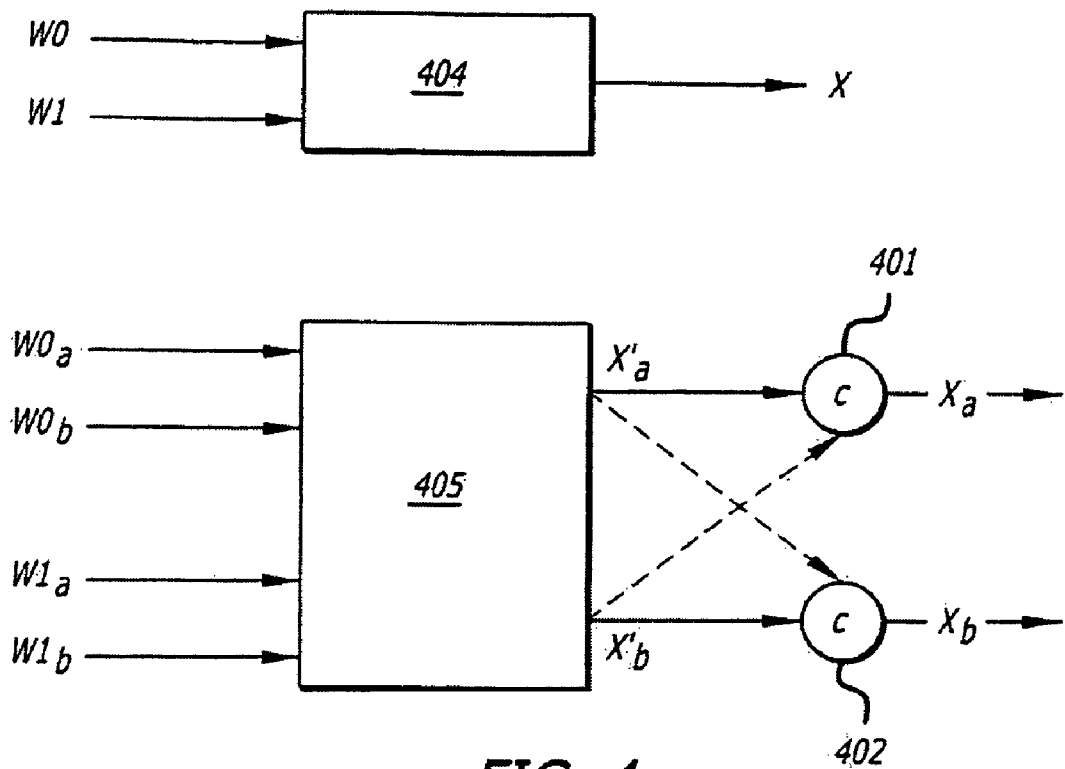
FIG. 4 is a block diagram of an embodiment of an SEU tolerant circuit.

FIG. 4 illustrates an embodiment of the double-checked circuit. Every variable in the doubled-up PRS becomes a state-holding variable. We sometimes need staticizers for these variables in a CMOS-implementation. However, the symmetry that results from doubling up helps doubled-up variables change their values simultaneously. States where nodes $x_a$ and $x_b$ are not driven last only for a very short time. So we can avoid some staticizers for the doubled-up nodes in practical implementations.

Referring now to FIG. 4, a typical gate 404 with inputs w0 and w1, having output x is shown. The double checked gate 405 of an embodiment of the invention doubles each input so that input w0 becomes inputs $w0_a$ and $w0_b$; and input w1 becomes inputs $w1_a$ and $w1_b$. Output x becomes output $x'_a$ and $x'_b$, both of which are coupled to C elements 401 and 402. C element 401 provides output $x_a$ and C element 402 provides output $x_b$. The system of FIG. 4 is free from deadlock and abnormal computations caused by SEU. In other words, the PRSC is SEU tolerant.

Transistor Level Embodiment

Figure 8:
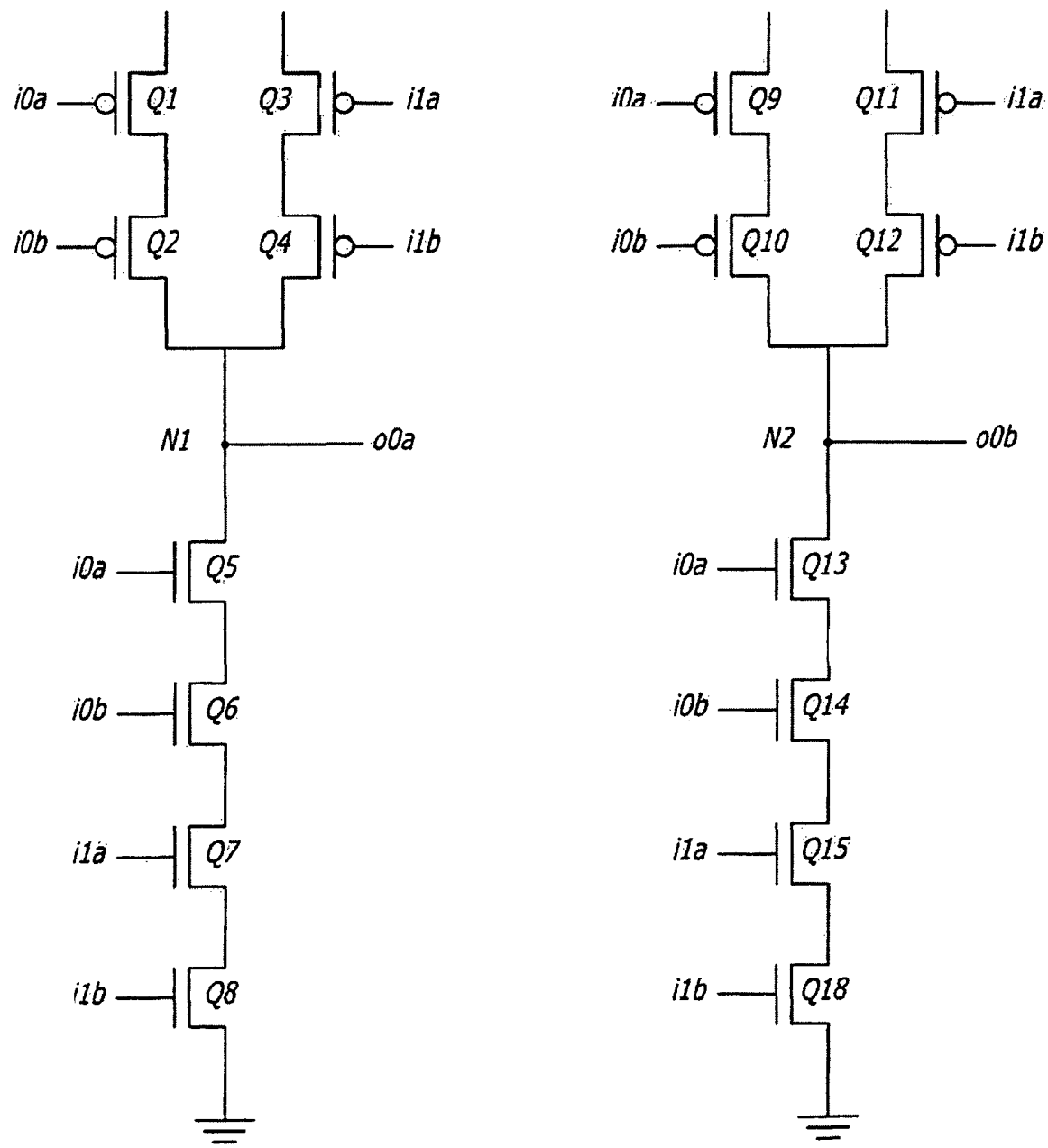
FIG. 8 is an example of a transistor level implementation of an embodiment of the invention.

FIG. 8 is a circuit diagram illustrating a transistor level embodiment of the invention. FIG. 8 illustrates a doubled up NAND gate using the rules of the invention. P Transistor Q1 is coupled through p transistor Q2 to output node N1. The gate of Q1 receives input i0a and the gate of transistor Q2 receives input i0b. P type transistor Q3 is coupled through p transistor Q4 to node N1. The gates of transistors Q3 and Q4 receive inputs i1a and i1b respectively. Node N1 is coupled to ground through n type transistors Q5, Q6, Q7, and Q8. The gates of these transistors receive inputs i0a, i0b, i1a, and i1b respectively.

In the other half of the circuit, p Transistor Q9 is coupled through p transistor Q10 to output node N2. The gate of Q9 receives input i0a and the gate of transistor Q10 receives input i0b. P type transistor Q11 is coupled through p transistor Q12 to node N2. The gates of transistors Q11 and Q12 receive inputs i1a and i1b respectively. Node N2 is coupled to ground-through n type transistors Q13, Q14, Q15, and Q16. The gates of these transistors receive inputs i0a, i0b, i1a, and i1b respectively.

The embodiment of FIG. 8 shows doubling up but not double checking. The circuit could be modified by cross coupling outputs o0a and o0b to C elements.

Multiple-Event Upset

We call variables related to doubling up and double checking such as $x_a$, $x_b$, $x'_a$ and $x'_b$ correlated variables. If multiple upsets happen among uncorrelated variables, the doubled-up PRS with double checking still computes correctly, because uncorrelated doubled-up variables such as $x_a$, $y_a$ are restored by their own double-checking PRs.

Generally, the time interval between one SEU and the next SEU in the system is larger than the cycle time of a computation. If not, there may be an accumulated-SEU problem. For example, an SEU at a double-checking variable $x'_a$ may keep a corrupt value for a long enough time that it may overlap with another SEU at $x_b$. Two accumulated SEUs at correlated variables can defeat the SEU-tolerance of the double-checked PRS. In a CMOS implementation, this problem can be resolved by introducing weak C-elements, as shown in FIG. 5.

Figure 5:
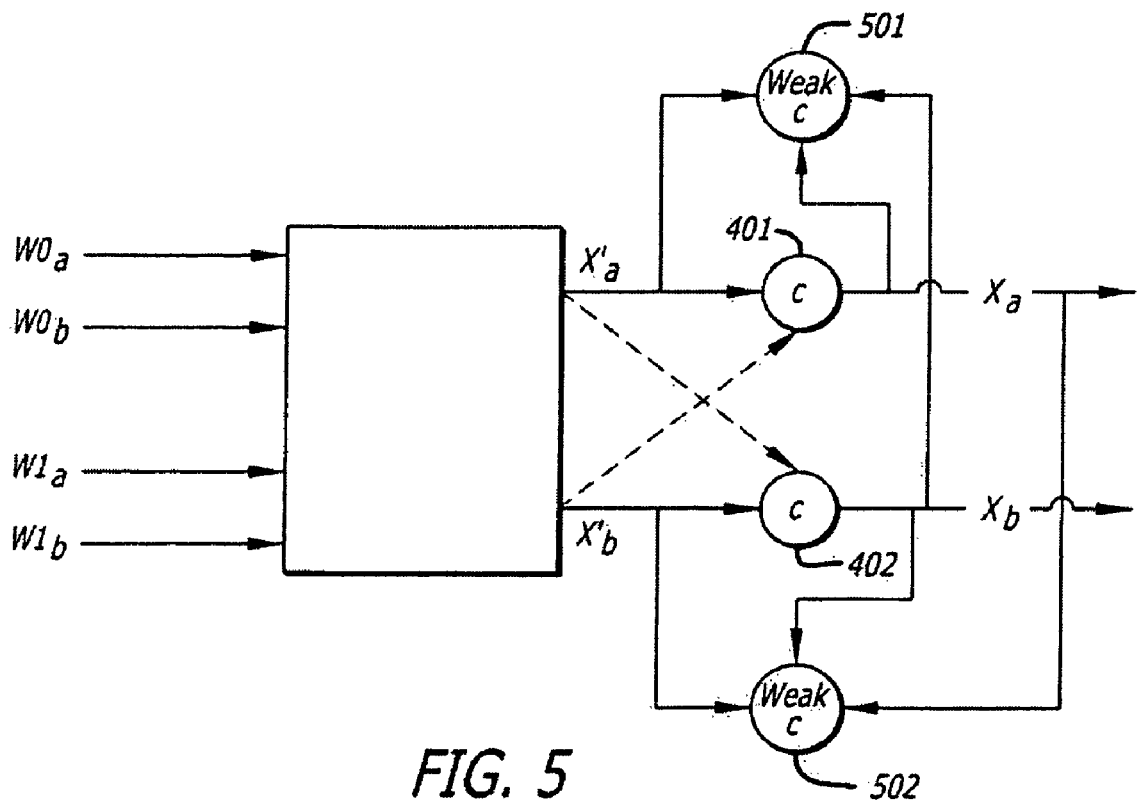
FIG. 5 is a block diagram of another embodiment of the invention.

The circuit of FIG. 5 is similar to the circuit of FIG. 4 with the addition of weak C elements 501 and 502. Weak C element 501 receives as input the $x'_a$ value, and the $x_a$ and $x_b$ output values. Weak C element 502 receives as input the $x'_b$ value, and the $x_a$ and $x_b$ output values.

The weak C-elements get $x_a x_b$ to restore corrupt $x'_a x'_b$ when the double-checking C-elements are disabled. If an SEU happens at $x'_a$ in the state s=( ... $x_a x_b x'_a x'_b$ ... )=( ... 0000 ... ) or ( ... 1111 ... ), then the weak C-elements are enabled to correct $x'_a$. In other possible states such as ( ... 0010 ... ), ( ... 0001 ... ) and etc., the weak C-elements are not driven, or $x'_a x'_b$ are driven by stronger gates so that the circuit behaves the same as a circuit without weak C-elements. So if necessary, we can add weak C-elements to resolve the accumulated-SEU problem.

Doubled-Up Buffer Reshufflings

If a communication channel is replaced with wait and assignment of one variable, an SEU at the communication variable breaks the communication protocols. Though doubling-up PRS is a direct approach to resolve this, we can adapt the doubled-up approach to the HSE level. That is, we double up all variables used for communication in HSE and have Doubled-up HSE (DHSE). The doubled-up active four-phase protocol, passive four-phase and lazy-active protocol for a channel L are as follows:

La↑, Lb↑; [¬Lea∧¬Leb]; La⇓, Lb⇓[Lea∧Leb]
[La∧Lb]; Lea↑, Leb↑; [¬La∧¬Lb]; Lea⇓, Leb⇓
[Lea∧Leb]; La↑, Lb↑; [¬Lea∧¬Leb]; La⇓, Lb⇓

Direct implementation of a system with the DHSE requires a state variable and may have too much sequencing to produce efficient circuits. Instead, some actions of the DHSE may be reordered to reduce the amount of sequencing and the number of state variables. This transformation, called reshuffling, is a source of significant optimization. Every reshuffling for correct DHSE implementation should maintain the handshaking protocols on channels.

A simple buffer without data communication is an embodiment to which we apply the DHSE. The CHP specification of the buffer is * [L; R], and a DHSE of the buffer without reshuffling is as follows:

*[[La∧Lb]; Lea↑, Leb↑; [¬La∧Lb]; Lea⇓, Leb⇓;
[Rea∧Reb]; Ra↑, Rb↑; [Rea∧¬Reb]; Ra⇓, Rb⇓]

There are three requirements for a valid reshuffling, and they are similar to reshuffling requirements of a normal buffer except that every variable is doubled up.

1. The number of inputs is at least the number of out-puts #La↑−#Ra↑≧0 and#Lb↑−#Rb↑≧0.

2. This is a "buffer" and is supposed to acknowledge the input of the channel L independently from the acknowledgment of the channel R. That is, (Lea⇓, Leb⇓) occurs concurrently with [¬Rea∧Reb], otherwise the reshuffling result will be like a direct connection. This is the constant response time requirement.

3. If (Lea⇓, Leb⇓) comes before [¬Rea∧¬Reb], the input data from the channel L would need to be saved in internal state variables. It makes the circuit larger. So [¬Rea∧Reb] comes before (Lea⇓, Leb⇓).

Given these requirements, there are several valid reshufflings. Though each reshuffling has different features, it may be desirable to have fewer transistors and faster operation. By that metric we can choose three reshufflings, which are similar to the conventional PCFB, PCHB and WCHB. They are referred to here as Doubled-up PCFB (DPCFB), Doubled-up PCHB (DPCHB) and Doubled-up WCHB (DWCHB), and they are as follows:

DPCFB=
*[([Rea∧Reb∧La]; Ra↑; [Lb]; Lea⇓; ena⇓;
([¬Rea∧¬Reb]; Ra⇓; [¬La∧¬Lb]; Lea↑); ena↑),
([Rea∧Reb∧Lb]; Rb↑; [La]; Le⇓; enb⇓;
([¬Rea∧¬Reb]; Rb⇓; [¬La∧¬Lb]; Leb↑); enb ↑)]

DPCHB=
*[([Rea∧Reb∧La]; Ra↑; [Lb]; Lea⇓;
([¬Rea∧¬Reb]; Ra⇓; [¬La∧Lb]; Lea↑),
([Rea∧Reb∧Lb]; Rb↑; [La]; Leb⇓;
([¬Rea∧¬Reb]; Rb⇓; [¬La∧¬Lb]; Leb↑)]

DWCHB=
*[([Rea∧Reb∧La]; Ra↑; [Lb]; Lea⇓;
([¬Rea∧¬Reb∧¬La]; Ra⇓; [¬Lb]; Lea↑),
([Rea∧Reb∧Lb]; Rb↑; [La]; Leb⇓;
([¬Rea∧¬Reb∧¬Lb]; Rb⇓; [¬La]; Leb↑)]

Let us look into the handshake of channels. The projection of the DPCHB onto the L channel is as follows:

*[([La∧Lb]; Lea⇓; [¬Lea∧¬Leb]; Lea↑),
([Lb∧La]Leb⇓; [¬La∧¬Lb]; Leb↑)]

And the environment of channel L behaves as follows:

*[([Lea∧Leb]; La⇓; [¬La∧Lb]; La↑),
([Leb∧Lea]Lb⇓; [¬Lea∧¬Leb]; Lb↑)]

The environment gives the restriction that [¬La∧¬Lb] does not hold until both Lea⇓ and Leb⇓ are completed. Therefore the projection of the DPCHB onto L channel is equivalent to *[[La∧Lb]; Lea⇓, Leb⇓; [¬La∧¬Lb]; Lea↑, Leb↑]. It can be easily shown that the remaining requirements are satisfied, and the proof is omitted.

The DPCHB has the following PRS:

Lea∧Rea∧Reb∧La→Ra↑
Leb∧Rea∧Reb∧Lb→Rb↑
¬Lea∧Rea∧¬Reb→Ra⇓

¬Leb∧¬Rea∧¬Reb→Rb⇓
Lb∧Ra→Lea⇓
La∧Rb→Leb⇓
¬La∧¬Lb∧¬Ra→Lea⇑
¬La∧¬Lb∧¬Rb→Leb⇑

PRSCs of the DPCFB, DPCHB and DWCHB with SEU have no abnormal-computation paths. In other words, even though we weaken guards, the environment waits for completion of doubled-up variables to keep the environment from computing abnormally.

Decompositions

Long series of transistors have bad effects on a circuit such as charge sharing and slow slew rate. But we can avoid long series of transistors by inserting intermediate variables.

Assume one gate in an SEU-tolerant PRS is as follows:

$(B_u \land G_o) \lor G_1 \lor \ldots G_n \to z\uparrow$
$(B_d \land G_o') \lor G_1' \lor \ldots G_m' \to z\Downarrow$ If the gate satisfies the following three requirements, we can introduce a new variable without violating the non-interference, stability and SEU-tolerance.

1. $\neg B_u \lor \neg B_d$ always holds
2. $\neg B_u \lor \neg G_1 \lor \ldots \lor \neg G_n$ and $\neg B_d \lor \neg G_1' \lor \ldots \lor \neg G_m'$ always hold.
3. $B_u$ holds until z becomes true, and $B_d$ holds until z becomes false.

Figure 6:
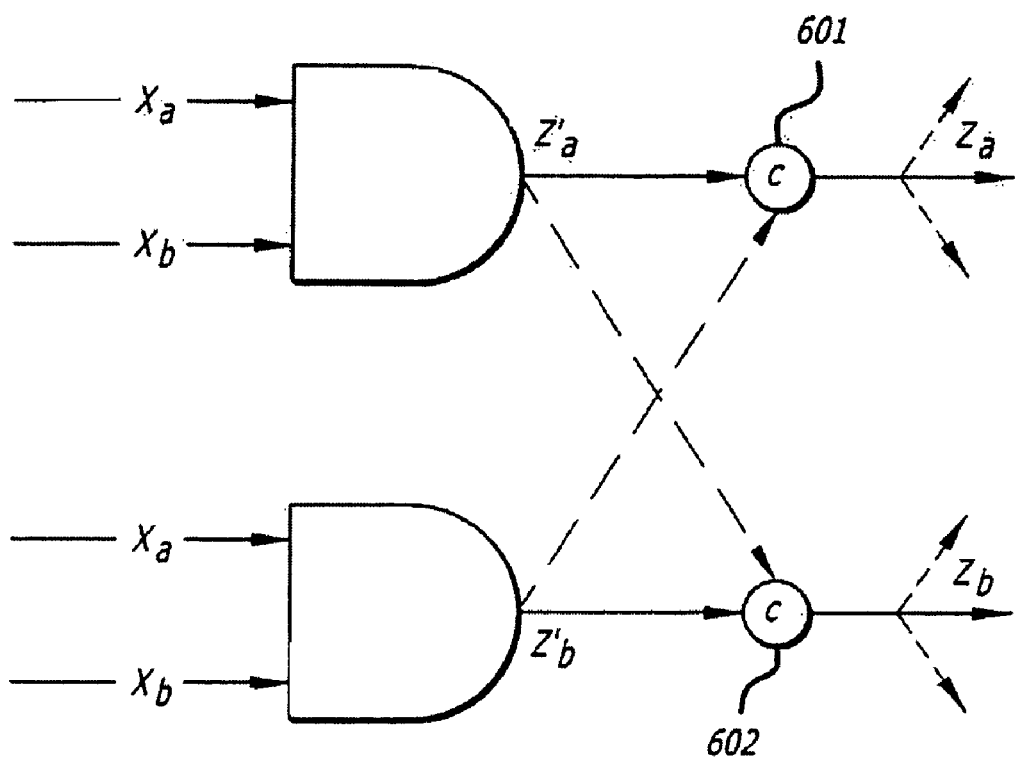
FIG. 6 is a block diagram of a DD gate of an embodiment of the invention.

We can decompose the gate as follows:

$B_u \to w\uparrow$
$B_d \to w\Downarrow$
$(w \land G_0) \lor G_1 \lor \ldots \lor G_n \to z\uparrow$
$(w \land G_0) \lor G_1 \lor \ldots \lor G_m \to z\Downarrow$ Duplicated Double-Checking PRS One embodiment of the invention provides a duplicated double-checking PRS (DDPRS). To implement a DDPRS, duplicate all PRs in the original PRS and double-check all output variables. Double-checking duplicated output variables $z_a$, $z_b$ means that we replace $z_a$, $z_b$ with new variables (e.g., $z'_a$, $z'_b$) and introduce two C-elements that share the inputs $z'_a$ and $z'_b$ called checked-in (CI) variables, and whose outputs are $z_a$ and $z_b$, called checked-out (CO) variables. Two variables (e.g., $x_a$, $x_b$ shown below) that encode the same bit, are called duplicated variables. The PRS of a gate are $G_p(\ldots, x, \ldots) \to z\uparrow$
$G_n(\ldots, x, \ldots) \to z\Downarrow$ and the PRS of the corresponding DD gate are:

$G_p^a(\ldots, x_a, \ldots) \to z'_a\uparrow$
$G_p^b(\ldots, x_b, \ldots) \to z'_b\uparrow$
$G_n^a(\ldots, x_a, \ldots) \to z'_a\Downarrow$
$G_n^b(\ldots, x_b, \ldots) \to z'_b\Downarrow$
$z'_a \land z'_b \to z_a\uparrow, z_b\uparrow$
$\neg z'_a \land \neg z'_b \to z_a\Downarrow, z_b\Downarrow$ FIG. 6 illustrates a DD gate. The DD gate comprises two plain gates and two double checking C-elements. Referring to FIG. 6, duplicated variables $x_a$ and $x_b$ are provided to duplicate AND gates. The outputs of the AND gates are checked in variables $z'_a$ and $z'_b$, which are both provided to C elements 601 and 602. The checked out variables are $z_a$ and $z_b$ from C-elements 601 and 602 respectively.

Figure 7:
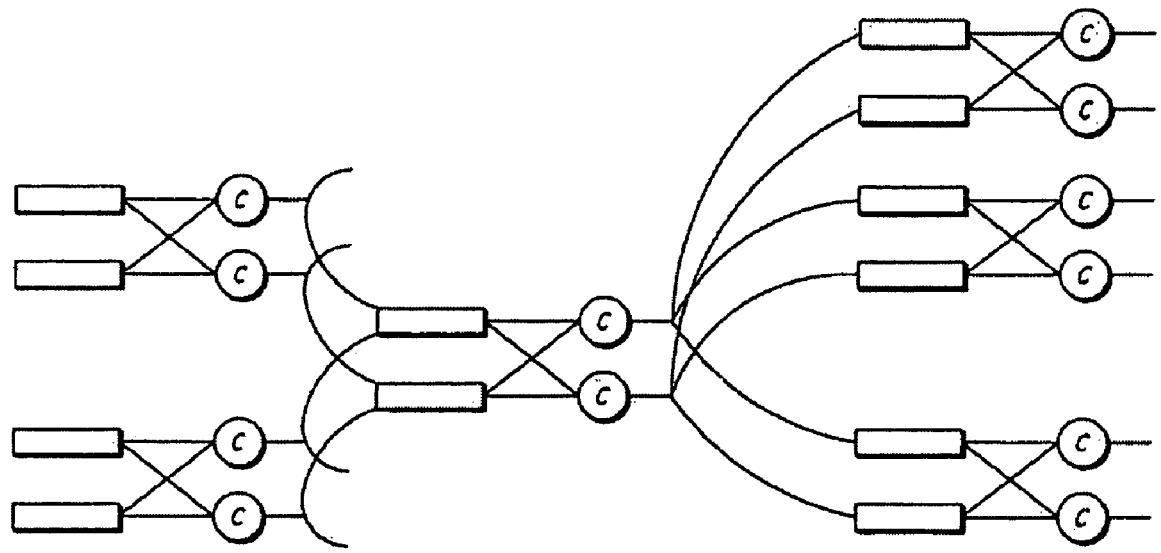
FIG. 7 is a block diagram of a DD circuit of an embodiment of the invention.

If the original PRS is stable and non-interfering, then the DDPRS is also stable and non-interfering. Moreover, the DDPRS has an additional property on its CI variables, called pseudo doubled-up stability. That is, assignments of output CI variables (such as $z_a$ and $z_b$) can fire only after both input CI variables $x'_a$ and $x'_b$ have the same value, and $x'_a$ and $x'_b$ are reset only after the assignments of $z'_a$ and $z'_b$ are completed. FIG. 7 illustrates an embodiment of a resulting DDPRS.

If there are at least three DD gates in each feedback cycle of gates, then a DDPRS is free from deadlock and abnormal computations caused by soft error. The soft-error-tolerance of DDPRS is based on the fact that at least one duplicated variable of each pair in DDPRS will contain a correct value, and that the double-checking scheme prevents corrupted values from propagating to subsequent gates.

Optimization

There are circumstances where application of the techniques of the invention could result in duplication of circuits plus associated C-elements for each circuit. However, there are circumstances where the use of C-elements can be limited to outputs only, reducing device count. For example, when there are two or more input Boolean functions with a single output, the circuit can be implemented with duplication of Boolean functions without C-elements, with C-elements applied to the output for double-checking.

In another embodiment, if there is a tree of multiple C-elements and combinational logic between C-elements, and all inputs of the C-elements are exercised on each cycle (e.g. all up, or all down), the solution can be optimized to reduce device count. Another case is when there are multiple C-elements by themselves, and all C-elements are exercised on each cycle.

Thus, SEU tolerant circuits have been described.

What is claimed is:

1. A circuit that is tolerant to soft error comprising:
correction means for maintaining the state of the circuit in the presence of a soft error; the correction means comprising a stable and non-interfering and pseudo-doubled-up stabilized circuit configured to operate according to a production rule set (PRS) satisfying the condition G→S where G remains true until an assignment S is completed, where G is a Boolean expression and S is a simple assignment; the correction means for maintaining the state of the circuit maintaining the validity of the input conditions until a correct output has been recognized by another component coupled to the circuit.

2. The circuit of claim 1 wherein the correction means comprises duplicate copies of the circuit output used as inputs to a C-element.

3. The circuit of claim 1 wherein the correction means comprises duplicate copies of the circuit output used as inputs to a pair of C-elements.

4. The circuit of claim 1 wherein the circuit is an asynchronous quasi delay-insensitive (QDI) circuit.

5. The circuit of claim 3 further including a pair of weak C-elements coupled to the pair of C-elements.

6. The circuit of claim 1 further including a second correction circuit that is non-interfering with the correction circuit.

7. A circuit that is tolerant to soft error, comprising:
correction circuitry configured to maintain the state of the circuit in the presence of a soft error, the correction circuitry comprising a stable and non-interfering and pseudo-doubled-up stabilized circuit configured to operate according to a production rule set (PRS) satisfying the condition G→S where G remains true until an assignment S is completed, where G is a Boolean expression and S is a simple assignment; the correction means for maintaining the state of the circuit maintaining the validity of the input conditions until a correct output has been recognized by another component coupled to the circuit.

* * * * *